United States Patent [19]
Takahashi

[11] Patent Number: 5,930,149
[45] Date of Patent: Jul. 27, 1999

[54] TEST-VECTOR EDITING SYSTEM AND METHOD

[75] Inventor: Toshihiro Takahashi, Osaka, Japan

[73] Assignee: Ricoh Company, Ltd., Tokyo, Japan

[21] Appl. No.: 08/947,759

[22] Filed: Oct. 9, 1997

Related U.S. Application Data

[63] Continuation of application No. 08/535,867, Sep. 28, 1995, abandoned.

[30] Foreign Application Priority Data

Sep. 30, 1994 [JP] Japan .................................. 6-237368

[51] Int. Cl.$^6$ ............................ G06F 17/00; G06F 17/50
[52] U.S. Cl. ......................... 364/489; 364/488; 364/490; 364/491
[58] Field of Search ................................... 364/488, 489, 364/490, 491; 395/500

[56] References Cited

U.S. PATENT DOCUMENTS

| 5,051,996 | 9/1991 | Bergeson et al. ..................... 371/22.4 |
| 5,485,471 | 1/1996 | Bershteyn ............................ 371/27.2 |
| 5,581,563 | 12/1996 | Penza et al. ........................ 371/22.1 |

FOREIGN PATENT DOCUMENTS 5127942 of 1993 Japan .

OTHER PUBLICATIONS

Mao et al. "Quretzt: A Quieert Currant Testing Methodology for Detecting Leakage Faults," IEEE, 1990, pp. 280–283.
Nigh et al "Test Generation for Current Testing," IEEE, 1989, pp. 194–200.
Marcel Jacomet "Fantestic: Towards a Powerful Fault Analysis and Test Pattern Generator for ICs," IEEE, 1989, pp. 633–642.
Ferguson "Testing for Parauetic Faults in Static EMOS Circuits," IEEE, 1990, pp. 436–441.
Tinaztepe et al, "Functional Test Program Generator–Through Interactive Graphics," IEEE, 1988, pp. 551–558.
Swari et al, "CrossCheck—A Practical Solution for ASIC Testability," IEEE, 1989, pp. 903–908.
Sy–Yen Kuo "Locating Logic Design Errors Via Test Generation and Don't–Care Propagation," IEEE, pp. 466–471, Sep. 1992.
Frietzemeier et al "Increased CMOS IC Stuck–at–Fault Coverage with Reduced Iddq Test Sets," IEEE, pp. 427–435, Sep. 1990.
Software For Selecting Patterns For Iddq Test Of CMOS, LSI, Nikkei Electronics, (No. 586), Jul. 19, 1993.
Gheewala, T., Introduction to Current Testing, CrossCheck Technology, Inc., pp. 1–4, (No Date).
Product Brief, CurrenTest™ Solution, CrossCheck Technology, Inc., (No Date).
Runyon, S., New Tool Synthesizes Iddq Test Structures, Electronic Engineering Times, Issue 793, Apr. 18, 1994.

*Primary Examiner*—Kevin J. Teska
*Assistant Examiner*—Vuthe Siek
*Attorney, Agent, or Firm*—Cooper & Dunham LLP

[57] ABSTRACT

It is determined whether a given logic state surely fulfills a predetermined logic-state condition, and also it is also determined whether the given logic state possibly fulfills the predetermined logic-state condition. The determination by the first determining unit is performed by determining whether the given logic state is a certain state and also agrees with a logic state required by the predetermined logic-state condition. The determination by the second determining unit is performed by determining whether the given logic state is an uncertain state and therefore does not completely agree with the logic state required by the predetermined logic-state condition. The predetermined logic-state condition is predetermined so that, when a signal having a logic state required by the predetermined logic-state condition appears at a relevant pin of a given electric circuit, no legal DC current flows through the relevant pin.

12 Claims, 5 Drawing Sheets

TEST-VECTOR EDITING SYSTEM AND METHOD

This is a continuation of application Ser. No. 08/535,867 filed Sep. 28, 1995 now abandoned.

BACKGROUND OF THE INVENTION

1. Field of the Invention

The present invention relates to a tester used for testing a semiconductor circuit device. During testing, the tester inputs a test pattern to the semiconductor circuit device and determines whether or not the semiconductor circuit device is good or bad based on a result as to how the semiconductor circuit device responds to the input test pattern.

In particular, the present invention relates to a test-vector editing system and method for generating and editing test vectors which are used for performing a static supply (electric) current ($I_{DDQ}$) test of a CMOS circuit.

2. Description of Related Art

Recently, with progress of miniaturization and circuit density improvement of semiconductor integrated circuits, various new defect modes have been appearing which could not be detected through conventional testing methods. Such defects could not be detected through a conventional test and thus semiconductor circuits which should have been determined as being bad might be shipped or incorporated into apparatuses as being good.

As a new testing method for detecting such defects, a method is being used which sets various states of a semiconductor circuit and then measures static supply (electric) currents flowing through the semiconductor circuit at each of the various states.

The static supply (electric) current or quiescent power supply current, $I_{DDQ}$, is an electric current flowing through a CMOS circuit during inputting of a same test vector to the semiconductor circuit being maintained. $I_{DDQ}$ is very low in a defect-free circuit. Therefore, if $I_{DDQ}$ of a substantial electric current flows through the semiconductor circuit, it can be determined that the semiconductor circuit contains some defects. Thus, by measuring $I_{DDQ}$, whether or not the semiconductor circuit contains some defects can be determined. Such a test is generally referred to as $I_{DDQ}$ test.

In order to detect all possible defects, it is necessary to set various states of a relevant semiconductor circuit and measure $I_{DDQ}$ at each state. For the purpose of setting such various states, it is necessary that various test vectors are inputted to the semiconductor circuit and $I_{DDQ}$ responding to inputting of each test vector is measured.

The test vector or test pattern is a set of signals indicating logic states respectively to be input to particular terminals (input pins, output pins, and both-input-and-output pins) of a semiconductor circuit in parallel at each test cycle.

Whether or not the semiconductor circuit contains any defects is determined from a result as to whether or not a substantial electric current of $I_{DDQ}$ flows therethrough in response to the inputting of test vector thereto. However, it is possible that the semiconductor circuit includes circuit constructs such that a legal DC current of $I_{DDQ}$ flows through the semiconductor circuit when a certain test vector is inputted thereto. The legal DC current means a DC electric current which flows through a semiconductor circuit due to predetermined circuit constructs, not due to any defect of the semiconductor circuit. In a such a case of legal-DC-current flowing, a defect-free semiconductor circuit may be determined as containing defects. Such circuit constructs include tri-state busses, floating nodes, certain RAM sense amplifier circuits, pull-up or pull-down resistors on I/O pins, or internal bus-holders.

If a relevant semiconductor circuit includes such circuit constructs, it is necessary to remove, from test vectors to be used in $I_{DDQ}$ test therefor, test vectors which set states of the semiconductor circuit such that legal DC currents of $I_{DDQ}$ flow therethrough.

There is a method for detecting similar defects of semiconductor circuits disclosed in Japanese Laid-Open Patent Application No.5-127942. In the method, "0" is set to all internal nodes of an integrated circuit, and also a power supply voltage which is low enough to keep OFF states of all transistors therein. In this state, power supply currents flowing therethrough are measured. However, effectiveness of this method has not been confirmed.

Three methods can be considered for obtaining test vectors for the $I_{DDQ}$ test, which vectors do not include one which causes any legal DC current to flow through a relevant semiconductor circuit when being inputted thereto.

A first method will now be described. A sample of a relevant CMOS circuit is actually loaded in an IC tester. From among functional-test test patterns or functional-test test vectors for a functional test of the relevant CMOS circuit, various test vectors are selected in a try-and-error manner. The functional-test test vectors are test vectors which are inputted to the relevant semiconductor circuit in a predetermined sequence so as to make sure the semiconductor circuit can perform predetermined dynamic functions. Through the IC tester, each of the thus-selected test vectors is inputted to the sample of the circuit and response thereto is monitored. By repeating such an operation, a test vector can be obtained, which vector sets an internal state of the semiconductor circuit such that any legal DC current of $I_{DDQ}$ does not flow through the semiconductor circuit can be obtained in the internal state. This method requires considerable labor and time.

A second method will now be described. Test vectors particular for $I_{DDQ}$ test of a relevant CMOS circuit are created, each of which vectors sets an internal state of the semiconductor circuit such that any legal DC current of $I_{DDQ}$ does not flow through the semiconductor circuit can be obtained in the internal state. This method also requires considerable labor and time.

A third method will now be described. The above-described functional-test test vectors are automatically searched, in accordance with a certain law, for vectors, each of which set an internal state of a relevant CMOS circuit such that any legal DC current of $I_{DDQ}$ does not flow through the semiconductor circuit can be obtained in the internal state. For this search, a special apparatus may be used.

For example, Crosscheck Technology, Inc, 2833 Junction Avenue, Suite 100 San Jose, Calif. 95134, United States, provides a software, CurrenTest™, which realizes this third method.

As described above, the test vector or test pattern is a set of signals indicating logic states respectively to be input to particular terminals (input pins, output pins, and both-input-and-output pins) of a semiconductor circuit in parallel at each test cycle. The logic states may include not only certain states, "1"/"0" or "H"/"L", but also uncertain states. The uncertain states include "X" states (referred to as Don't Care or Mask). Normally, the logic states "1" and "0" are used for a vector inputting situation while "H" and "L" are used for vector outputting situation.

For example, there is a case where a functional test is performed only on a part of a semiconductor circuit. A test vector to be used for such a case may include non-defined logic states for circuit of inverter INV, when the logic state of "1" (high level) is inputted to an input pin 21, the n-type FET 12 is in an ON state and the p-type FET 11 is in an OFF state. As a result, an output pin 22 is substantially connected to a ground line GND and thus is at "L" state (low level). When the logic state of "0" (low level) is inputted to the input pin 21, the p-type FET 11 is in the ON state and the n-type FET 12 is in the OFF state. As a result, an output pin 22 is substantially connected to a positive voltage line Vcc and thus is at "H" state (high level).

In the circuit of inverter INV, only one of the two FETs 11 and 12 is in the ON state, and therefore no legal DC current flows between the positive voltage line Vcc and the ground line. However, there is a case where a pull-up resistor Ru or a pull-down resistor Rd is connected between the input pin 21 and the positive voltage line Vcc or ground line GND as shown in the figure by a broken line.

A purpose of providing the pull-up or pull-down resistor is to make sure the input level is high or low enough to cause an appropriate one of the two FETs 11 and 12 to be in the ON state and the other one to be in the OFF state. Thus, the operation of the inverter INV may be performed reliably. Specifically, the input pins. The non-defined logic states are those such that the logic states of the test vector, when being inputted to these input pins, do not substantially influence the functions of the relevant part of the semiconductor circuit. These non-defined logic states are the above-mentioned "X" states in the test vector.

Further, logic states for output pins, signals output from which output pins have no relation to the relevant part of the semiconductor circuit may not be defined and thus may be "X" states. Further, logic states for output pins, signals output from which output pins have certain relation to the relevant part of the semiconductor circuit but appearance of the relevant logic state are not stable along the time axis may also be "X" states.

Existence of such "X" states in test vectors may cause problems in a search performed in the above-described third method. Specifically, the above-mentioned certain law used in the third method is such that test vectors fulfill certain conditions are retrieved through the search.

FIG. 1 shows a CMOS circuit INV of an example of a logic element, an inverter. The inverter INV includes p-type and n-type FETs 11 and 12. In the pull-up and pull-down resistors are those effective when a relevant pin of a semiconductor circuit is in an undriven state. The undriven state is also referred to as a floating state or a high-impedance state, and is represented by "Z" in logical simulation.

If there is no provision of either the pull-down or pull-up resistor, when this pin is in the undriven state, an electric potential of this pin may problematically be an intermediate potential, which is neither "1" ("H") nor "0" ("L"). If so, there may be a problematical possibility that both of subsequently coupled p-type FET and n-type FET enter the ON state. This situation is different from a normal situation of this CMOS circuit in which 'only one of the p-type FET and n-type FET should be in the ON state.' Accordingly, this situation that both of p-type FET and n-type FET of a subsequent stage enter the ON state is problematic.

In order to prevent such a problematic situation from occurring, the pull-up resistor forcibly causes such an undriven pin to be in the "1" ("H") state and the pull-down resistor forcibly causes such an undriven pin to be in the "0" ("L") state. The provision of a pull-up or pull-down resistor is designed so that, although one of the pull-up or pull-down resistors is provided in the CMOS circuit, when the relevant pin is driven to be either in "1" ("H") or "0" ("L"), that is, either "1" or "0" is input for example, the relevant pin should enter the thus-driven state regardless of the provision of pull-up or pull-down resistor.

However, such pull-up or pull-down resistor may cause a legal DC current to flow through the CMOS circuit. For example, when the "1" state is inputted to the input pin 21 of the inverter INV which has the pull-down resistor Rd provided therein as shown in the figure, a legal DC current flows through the pull-down resistor Rd between the input pin 21 and the ground line GND. Similarly, when the "0" state is inputted to the input pin 21 of the inverter INV which has the pull-up resistor Ru provided therein as shown in the figure, a legal DC current flows through the pull-up resistor Ru between the positive voltage line Vcc and the input pin 21.

In order to prevent such legal DC current from flowing through a CMOS circuit which undergoes $I_{DDQ}$ test, it is necessary to retrieve test vectors, each of which does not cause such a state that the legal DC current flows through the CMOS circuit as described above with reference to FIG. 1. There is a case where circuit constructs possibly causing a legal DC current of $I_{DDQ}$ flowing through a relevant CMOS circuit in $I_{DDQ}$ test are only provision of pull-up or pull-down resistors. In this case, the above-mentioned certain conditions which test vectors to be retrieved should fulfill through the search of the third method are conditions, all of which should be fulfilled by each of the test vectors to be retrieved. If a test vector does not fulfill at least one of these conditions, the test vector causes such a state that the legal DC current flows through a pull-up or pull-down resistor and thus through the CMOS circuit as described above with reference to FIG. 1.

These conditions will now be listed below:

A) The state "1" be inputted to every input pin Pi having the pull-up resistor Ru such as that shown in FIG. 2A (the inverter INV is connected to the pin Pi);

B) The state "1" be inputted to every both-input-and-output pin Pb having the pull-up resistor Ru and in an input mode such as that shown in FIG. 2B (tri-state buffers B are connected to the pin Pb so as to change over input and output modes);

C) The state "L" or "Z" (the high impedance state of the tri-sate logic) be output from every output pin Po having the pull-up resistor Ru such as that shown in FIG. 2C;

D) The state "1" be inputted to every both-input-and-output pin Pb having the pull-up resistor Ru and in the output mode such as that shown in FIG. 2D;

E) The state "L" or "Z" be output from every output pin Po having the pull-down resistor Rd such as that shown in FIG. 2E;

F) The state "L" or "Z" be output from every both-input-and-output pin Pb having the pull-down resistor Rd in the output mode such as that shown in FIG. 2F;

G) The state "0" be inputted to every input pin Pi having the pull-down resistor Rd such as that shown in FIG. 2G; and H) The state "0" be inputted to every both-input-and-output pin Pb having the pull-down resistor Rd and in the input mode such as that shown in FIG. 2H.

(With regard to circuits shown in FIGS. 2A, 2B, 2C, 2D, 2E, 2F, 2G and 2H, each circuit is an example of an electric circuit located in a vicinity of external input/output pins in a CMOS LSI circuit. These circuits are only examples and various variants may be considered therefor. In another example, simple buffers may be used instead of the inverters in these circuits. Further, tri-state inverters may be used instead of the tri-state buffers.)

For example, a use of the above-described condition A) will now be described. If at least one input pin Pi having the pull-up resistor Ru is included in a relevant CMOS circuit, the condition A) be considered in the search for adequate test vectors in the third method. If the condition A) is expressed using a negative sentence, the condition A) becomes to a language that 'the state "0" not be inputted to the input pin Pi having the pull-up resistor Ru.'

If this input pin Pi has a certain state of "1" or "0" inputted thereto according to every one of the given functional-test test vectors, the search can be performed without causing any problem. A test vector including a state "0" for this input pin Pi cannot be used in $I_{DDQ}$ test. A test vector including a state "1" for this input pin Pi can be used in $I_{DDQ}$ test if the other necessary conditions are also fulfilled. Problems may occur when this input pin Pi has the uncertain state "X" inputted thereto according to a test vector.

In the above-described search of the third method, "X" state is treated as a state separate from each of "1" state and "0" state. Therefore, if "X" state is inputted to the input pin Pi having the pull-up resistor Ru according to a test vector, the test vector is determined as not fulfilling the condition A). Therefore, this test vector cannot be used in $I_{DDQ}$ test.

However, "X" state is a non-defined state but actually is either one of "1", "0", "H", "L", or "Z" state. For example, if "X" state be inputted to an input pin according to a test vector, either one of "1", "0", "H", "L", or "Z" state is inputted to this input pin actually in the IC tester. If "1" state is actually inputted to the input pin having the pull-up register in the IC tester, the condition A) is fulfilled and thus the relevant test vector can actually be used in $I_{DDQ}$ test.

Thus, according to the third method, determination as to whether or not particular test vectors can be used in $I_{DDQ}$ test is performed too much strictly. In fact, a test vector which may actually be used is determined as being inadequate as described above. Therefore, if the third method is used to search the given functional-test test vectors for test vectors to be used in $I_{DDQ}$ test, no adequate test vectors may be retrieved in an extreme case, or an a sufficient number of adequate test vectors for ensuring by $I_{DDQ}$ test that no defect is contained in the relevant CMOS circuit may not be retrieved.

SUMMARY OF THE INVENTION

An object of the present invention is to eliminate the above-mentioned problems and to provide a system for appropriately, rapidly selecting test vectors for $I_{DDQ}$ test from among the given functional-test test vectors for semiconductor circuits.

A feature of the present invention is to select or extract a possibly adequate test vectors in addition to surely adequate test vectors. In particular, a test vector having "X" logic states, each of which therefore does not surely fulfill the logic-state condition of a relevant condition, may be also selected. This concept may be applied to various cases of selecting or extracting test vectors adequate to particular circuit constructs of a relevant electric circuit.

According to the present invention, a test vector having "X" states (non-defined states) each of which therefore does not surely fulfill the logic-state condition of a relevant condition, is also selected as a candidate of a test vector surely adequate to $I_{DDQ}$ test or the like. As a result, it is possible to automatically, rapidly select or extract all test vectors which are possibly adequate to $I_{DDQ}$ test or the like. Thus, a user may rapidly obtain a necessary number of test vector adequate to $I_{DDQ}$ test or the like without omission.

The conditions, which are predetermined and used as criteria in accordance with which it is determined whether or not given test vectors are adequate to be used in $I_{DDQ}$ test or the like, are, for example the conditions A) through H) described with reference to FIGS. A through H.

Other objects and further features of the present invention will become more apparent from the following detailed description when read in conjunction with the accompanying drawings.

DESCRIPTION OF PREFERRED EMBODIMENT

Figure 1:
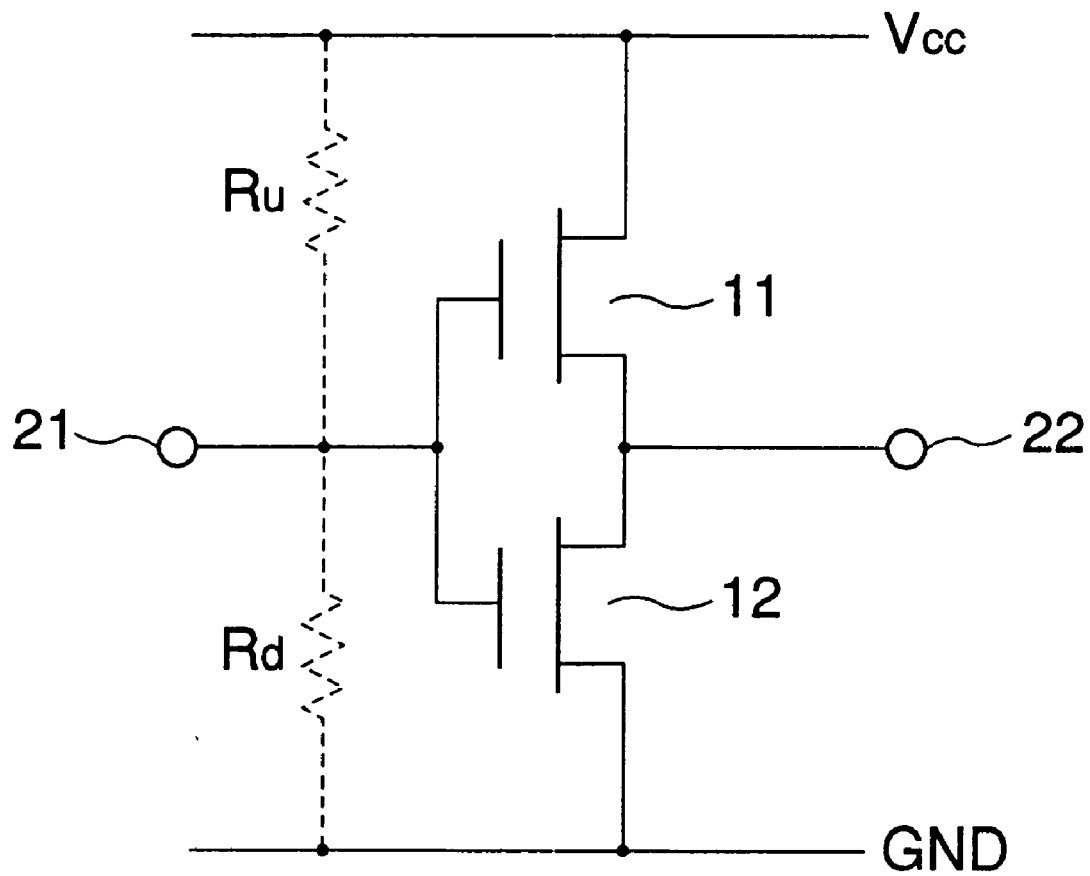
FIG. 1 shows a circuit diagram of an inverter of CMOS circuit.
Figure 2A:
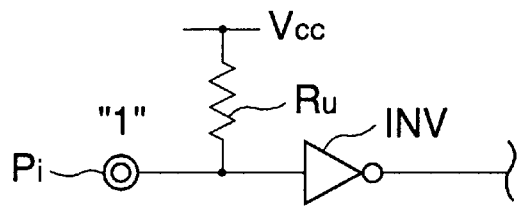
FIGS. 2A, 2B, 2C, 2D, 2E, 2F, 2G and 2H show circuit diagrams of examples of CMOS circuits.
Figure 2B:
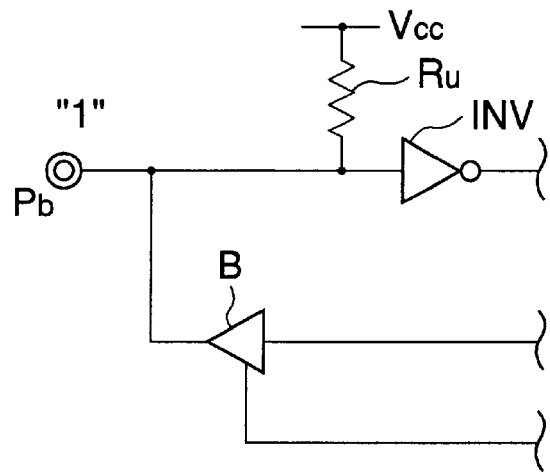
Figure 2C:
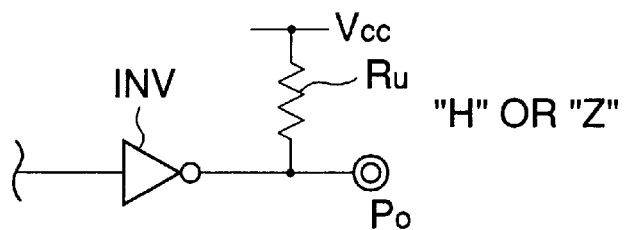
Figure 2D:
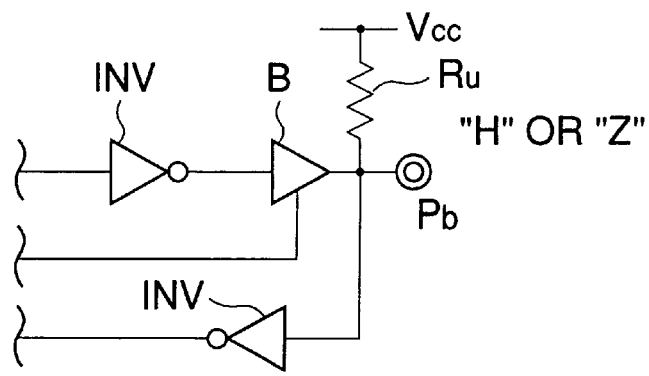
Figure 2E:
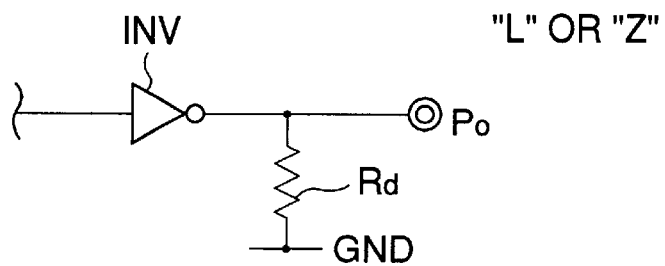
Figure 2F:
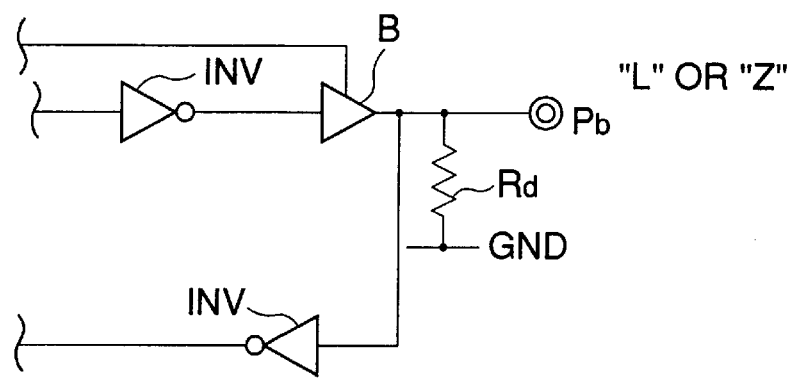
Figure 2G:
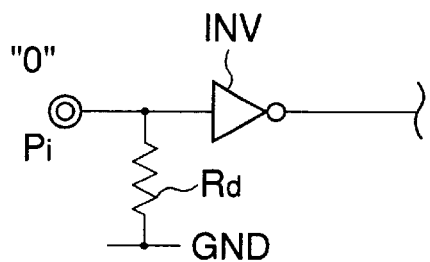
Figure 2H:
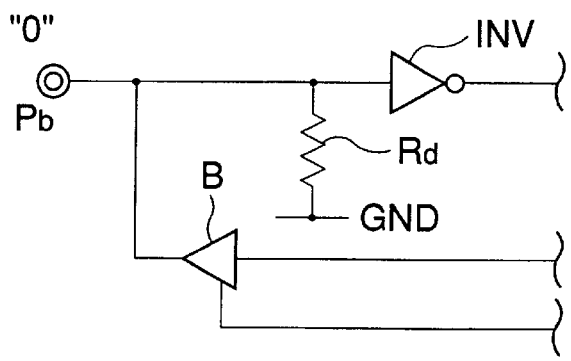
Figure 3:
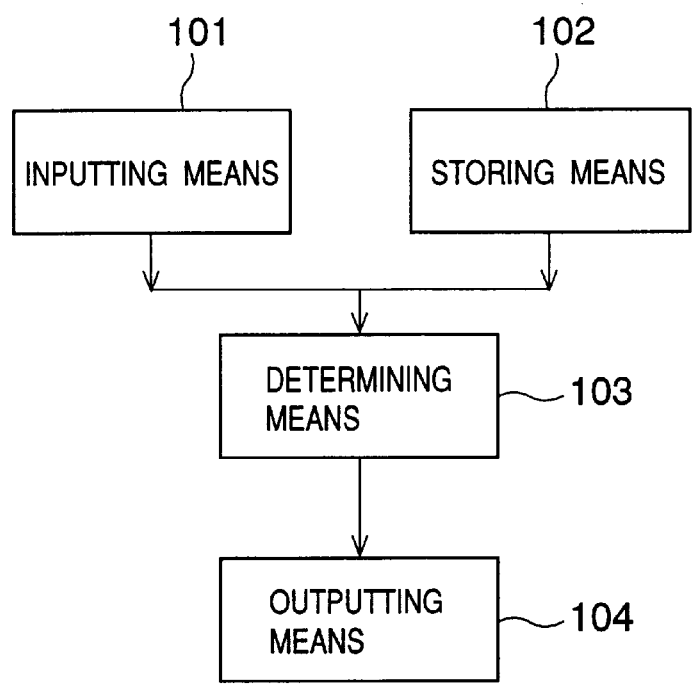
FIG. 3 shows a function-block diagram of a test-vector editing system in an embodiment of the present invention, the diagram separately indicating functions of the embodiment.
Figure 4:
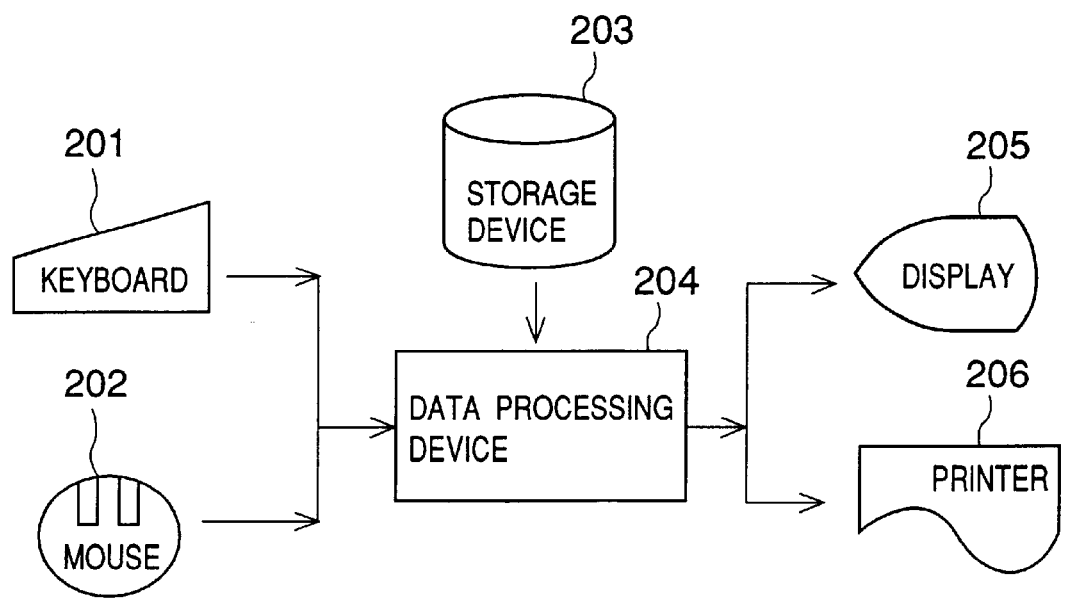
FIG. 4 shows a block diagram of the test-vector editing system, the diagram indicating actual devices for realizing the embodiment.

With reference to FIGS. 3 and 4, a test-vector editing system in an embodiment of the present invention will now be described.

An inputting means 101 shown in FIG. 3 is realized by a keyboard 201 or a mouse 202 shown in FIG. 4. This inputting means 101 is used for a user to input, to the test-vector editing system, predetermined conditions such as the conditions A) through H) described with reference to FIGS. 2A through 2H.

A storage means 102 shown in FIG. 3 is realized by a storage device 203, shown in FIG. 4, such as a disk drive device, a ROM and/or a RAM, or so. The storage means 102 is used for storing information representing given functional-test test vectors such as those mentioned above. Further, the storing means 102 is also used to store information representing the predetermined conditions input through the inputting means. Further, the storing means 102 is also used to store information representing circuit constructs of a relevant CMOS circuit. Further, the storing means 102 is also used to temporarily, appropriately store information representing test vectors or so which are being processed in editing operation.

A determining means 103 shown in FIG. 3 is realized by a data processing device 204, shown in FIG. 4, such as a CPU. The determining means 103 determines test vectors adequate to be used in $I_{DDQ}$ test. An outputting means 104 is realized by a display 205 or printer 206 shown in FIG. 4. The outputting means displays or prints information representing the test vectors determined as being adequate by the determining means 103.

Figure 5:
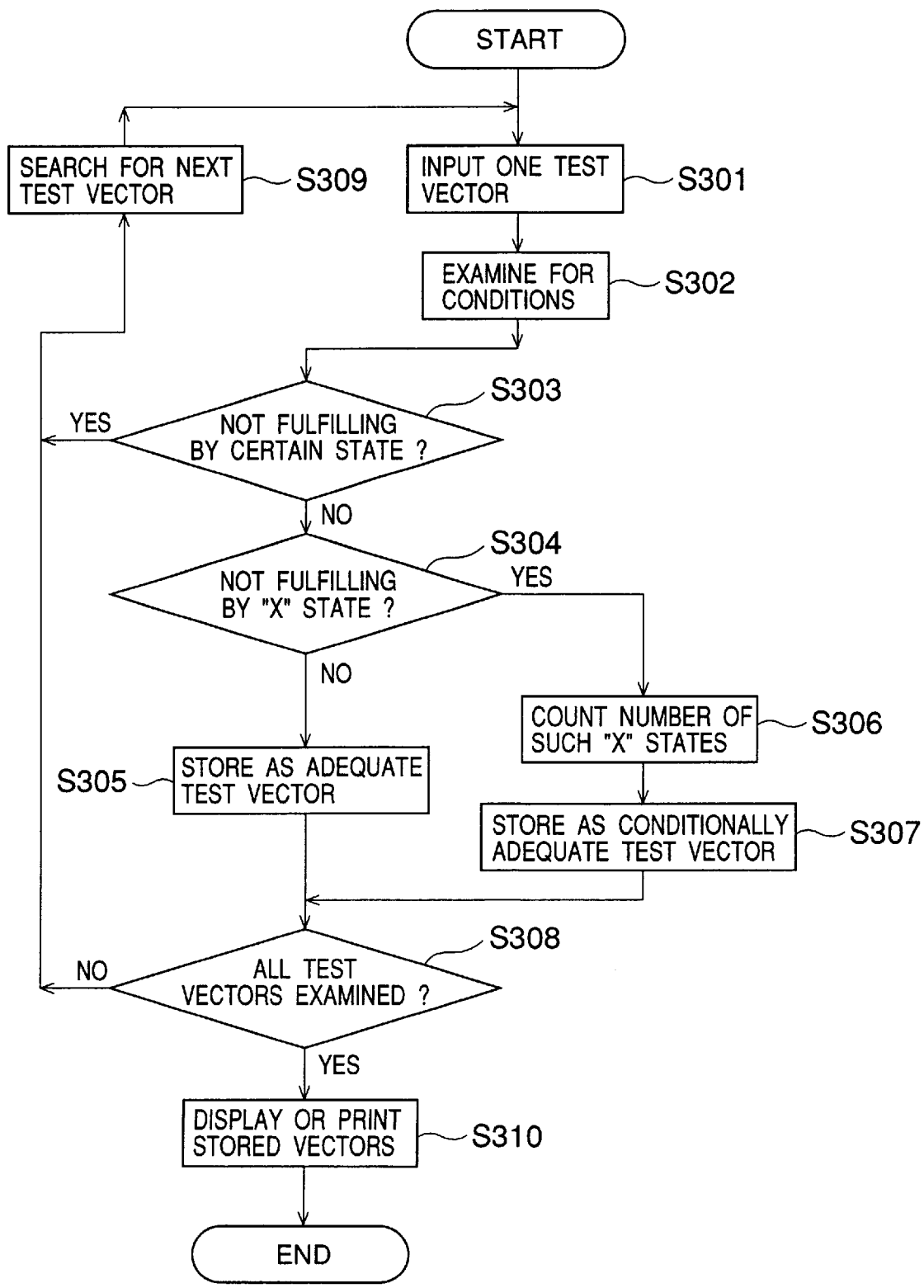
FIG. 5 shows a flowchart of operation performed by the test-vector editing system.

With reference to FIG. 5, the editing operation of the test-vector editing system in the embodiment of the present invention will now be described.

In a step S301 (the term 'step' being omitted, hereinafter), the determining means 103 inputs thereto a test vector from among the given functional-test test vector stored in the storing means 102. If it is in a first cycle of the editing operation, the test vector input in S301 is one which is inputted to the relevant CMOS circuit at a first test cycle in the functional test. If it is in a subsequent cycle of the editing operation, the test vector input in S301 is one which is inputted to the CMOS circuit at a corresponding subsequent test cycle in the functional test.

The determining means 103 then examines in S302 the thus-input test vector using the above-mentioned predetermined conditions, information of which was previously input through the inputting means 101 and stored in the storing means 102, and also using the information of the circuit constructs of the relevant CMOS circuit, the information being also stored in the storing means 102.

The predetermined conditions are those which are predetermined for determining whether or not an input test vector can be used in $I_{DDQ}$ test. If an input test vector does not fulfill all of the predetermined conditions, the test vector is one which causes the legal DC current of $I_{DDQ}$ to flow through the CMOS circuit when the test vector is inputted thereto. The legal DC current of $I_{DDQ}$ is, for example, an electric current flowing through the pull-up or pull-down resistor which may be included in the CMOS circuit as shown in FIGS. 2A through 2H. As described above, if such a legal DC current of $I_{DDQ}$ flows through the CMOS circuit when the test vector is inputted thereto, a relevant portion of $I_{DDQ}$ test may not provide any effective result.

The determining means 103, using the information of the circuit constructs of the relevant CMOS circuit, determines which one of the external connecting pins of the CMOS circuit is relevant to each of the above-mentioned predetermined conditions. For example, when the above-mentioned condition A) is used, the determining means 103 searches the external connecting pins for input pins having pull-up resistors respectively.

Then, in S303, the determining means 103, in the example concerning the condition A), determines whether a logic state of the input test vector relevant to each of thus-retrieved input pins is "1". As a result, if there is at least one non-"1" logic state among the logic states relevant to these input pins in the test vector, S303 is then performed. Thus, in S303, it is determined whether or not the given test vector does not fulfill at least one of the predetermined conditions, and when the given test vector does not fulfill at least one of the predetermined conditions, it is then determined whether or not this result has come because at least one logic state of the test vector is a certain logic state, "1", "0", "H", "L" or "Z", which does not fulfill the logic-state condition required by a relevant condition of the predetermined conditions. If the result has come because at least one logic state of the test vector is a certain logic state, "1", "0", "H", "L" or "Z", which does not fulfill the logic-state condition required by a relevant condition of the predetermined conditions, S309 is then performed. In the other case, S304 is then performed.

Then, in S304, the determining means 103, in the example concerning the condition A), determines whether a logic state of the input test vector relevant to each of thus-retrieved input pins is the above-described "X". As a result, if there is at least one "X" logic state among the logic states relevant to these input pins in the test vector, S306 is then performed. Thus, in S304, it is determined whether or not the given test vector does not fulfill at least one of the predetermined conditions, and when the given test vector does not fulfill at least one of the predetermined conditions, it is then determined whether or not this result has come because at least one logic state of the test vector is a uncertain logic state "X" which therefore does not surely fulfill the logic-state condition required by a relevant condition of the predetermined conditions. If the result has come because at least one logic state of the test vector is a uncertain logic state "X", which therefore does not surely fulfill the logic-state condition required by a relevant condition of the predetermined conditions, S306 is then performed. In the other case, S304 is then performed.

A situation that a result of S305 is NO means that it has been determined that the input test vector surely fulfills all of the predetermined conditions. As a result, in S305, information of the test vector is stored in the storing means 102 as being a test vector adequate for $I_{DDQ}$ test. In addition, the storing means 102 also stores information indicating that one test vector has been determined as being an adequate one.

In S306, the determining means 103 counts a number of "X" states of the test vector, each of which therefore does not surely fulfill the logic-state condition required by a relevant condition of the predetermined conditions. As mentioned above, "X" state is a non-defined state but actually is either one of "1", "0", "H", "L", or "Z" state in an actual test condition in the IC tester. Therefore, there is a possibility that the test vector including "X" states, each of which therefore does not surely fulfill the logic-state condition of a relevant condition may actually fulfill this condition in an actual test condition in the IC tester. As a number of such "X" states in an input test vector is smaller, a possibility that the test vector is adequate is larger. This is the reason for counting the number of such "X" states.

In S307, the determining means 103 determines the input test vector as being a conditionally adequate test vector because of existence of such "X" states. Information of the test vector is stored in the storing means 102 as being the conditionally adequate test vector for $I_{DDQ}$ test. In addition, the storing means 102 also stores information indicating that one test vector has been determined as being a conditionally adequate one.

Then, S308 is performed by the determining means 103. It is determined whether or not all of the given functional-test test vectors stored in the storing means 102 is processed in the current editing operation. If it is determined that at least one test vector remains to be processed in the current editing operation, S309 is performed. In S309, the determining means 103 searches for a subsequent, along the time axis of the given functional-test test vectors, test vector among the given functional-test test vectors.

If it is determined in S308 that all of the given functional-test test vectors have been processed in the current editing operation, S310 is performed. In S310, all the test vectors which have been stored in S305 and S307 are displayed or printed through the outputting means 104.

According to the above-described system in the embodiment of the present invention, a test vector having "X" states (non-defined states) each of which therefore does not surely fulfill the logic-state condition of a relevant condition, is also selected as a candidate of a test vector surely adequate to $I_{DDQ}$ test. As a result, it is possible to automatically, rapidly select or extract all test vectors which are possibly adequate to $I_{DDQ}$ test. Whether or not thus-selected candidate or conditionally adequate test vectors are surely adequate test vector may be determined in an actual $I_{DDQ}$ test performed using the IC tester of the like. Thus, a user may rapidly obtain a necessary number of test vectors adequate to $I_{DDQ}$ test without omission.

The predetermined conditions, which are used as criteria in accordance with which it is determined whether or not given functional-test test vectors are adequate to be used in $I_{DDQ}$ test, are not limited to the conditions A) through H) described with reference to FIGS. 2A through H. Depending on circuit constructs of relevant CMOS circuits, various conditions may be specified by users as these predetermined conditions. S302, S303 and S304 shown in FIG. 5 examine whether or not given functional-test test vectors meet such conditions or criteria specified by users by comparing logic states of each test vector with relevant logic states required in the specified conditions or criteria. By appropriately specifying the predetermined conditions, it is possible to select or extract test vectors from among given test vectors adaptably to particular circuit constructs of a relevant semiconductor circuit.

It is preferable that the test-vector editing system according to the present invention has a function such that a user inputs to the system a minimum number of test vectors required for in $I_{DDQ}$ test to ensure that a relevant CMOS circuit is a defect-free one through $I_{DDQ}$ test. In this case, in S308 shown in FIG. 5, it is determined whether or not a number of test vectors, which have been stored in S305 and S307 in a current editing operation, reaches the thus-input minimum number of test vectors required for $I_{DDQ}$ test. If it is determined that the stored number of test vectors has reached the minimum number of test vectors required, the current editing operation may be terminated even if all of the given functional-test test vectors have not been examined. Thus, it is possible to effectively reduce a time and a load required for obtaining a necessary number of test vectors to be used for $I_{DDQ}$ test.

Further, it is also preferable that a step is added before S310 shown in FIG. 5. In the additional step, test vectors which have been stored in S305 and S307 are appropriately sorted. Specifically, as a result of the sorting, as a test vector is more adequate for $I_{DDQ}$ test, an order of this test vector is higher. Then, in S310, these test vectors are displayed or printed according to the thus-obtained order.

An example of a manner of the sorting will now be described. As a test vector has a smaller number of "X" states, each of which therefore does not surely fulfill the logic-state condition of a relevant condition, this test vector is more adequate for $I_{DDQ}$ test. In this view point, a test vector which does not have such an "X" state is most adequate for $I_{DDQ}$ test.

Further, among test vectors, each having a same number of such "X" states, as a test vector which is preceding along the time axis of a given function-test test vectors, the test vector is preferable. In fact, after selecting test vectors from among the given function-test test vectors as those for the $I_{DDQ}$ test, when $I_{DDQ}$ test is actually performed, normally the given function-test test vectors are input, in the sequence along the time axis, to a relevant semiconductor circuit. Then, when the first one of the thus-selected test vectors is input as a result of the sequential inputting of the functional-test test vectors, the $I_{DDQ}$ test is actually performed. Therefore, as the selected test vectors are those more preceding along the time axis of the given function-test test vectors, it is possible to input the selected test vectors earlier during the sequential inputting of the given function-test test vectors. As a result, it is possible to reduce a time required for the $I_{DDQ}$ test. Normally, it is very costly to use the IC tester or LSI tester which is a tester to be used for the $I_{DDQ}$ test and so forth. Therefore, by reducing a time required for the $I_{DDQ}$ test, it is possible to reduce a time required for using the IC tester or LSI tester and thus reduce costs therefor.

By using a list of test vectors displayed or printed in the thus-obtained order, a user may select test vectors therefrom adaptably to various test conditions of $I_{DDQ}$ test or the like.

An application of the present invention is not limited to the above-described embodiment for obtaining test vectors for $I_{DDQ}$ test. A feature of the present invention is to select or extract a possibly adequate test vectors in addition to surely adequate test vectors. In particular, a test vector having "X" logic states, each of which therefore does not surely fulfill the logic-state condition of a relevant condition, may be also selected. This concept may be applied to various cases of selecting or extracting test vectors adequate to particular circuit constructs of a relevant electric circuit.

Further, the present invention is not limited to the above-described embodiment, and variations and modifications may be made without departing from the scope of the present invention.

What is claimed is:

1. A test-vector editing system for editing test vectors used for performing a static supply current test of a circuit, said system comprising:

first determining means for determining whether an input test vector, used as an input to test a circuit under test, includes all bits which provide a logic state which surely fulfills a predetermined definite logic-state condition;

second determining means for determining whether one or more bits of said input test vector are indefinite don't care logic-states; and selecting means for selecting as input test vectors the input test vectors which provide a logic state which surely fulfills the predetermined definite logic state condition as determined by the first determining means and as candidate input test vectors the input test vectors which include one or more indefinite don't care logic states as determined by said second determining means, wherein the indefinite don't care logic-states can be any one of a logical high state, a logical low state and a high impedance state.

2. The test-vector editing system according to claim 1, wherein:

determination by said first determining means determines whether said input vector provides a logic state that agrees with a logic state required by said predetermined logic-state condition; and determination by said second determining means also determines the number of indefinite don't care logic-states.

3. The test-vector editing system according to claim 1, wherein, determination by said first determining means determines whether said input vector provides a logic state which is a certain state and also whether the logic state fulfills the predetermined logic-state condition; and determination by said second determining means determines the number of indefinite don't care logic-states.

4. The test-vector editing system according to claim 1, wherein said predetermined logic-state condition is predetermined so that, when a signal having a logic state required by said predetermined logic-state condition appears at a relevant pin of a given electric circuit, no legal DC current flows through said relevant pin.

5. The test-vector editing system according to claim 1, wherein said predetermined logic-state condition is predetermined so that, when a signal having a logic state required by said predetermined logic-state condition appears at a relevant pin of a given CMOS circuit in a static supply current test of said CMOS circuit, no legal DC current flows through said relevant pin.

6. The test-vector editing system according to claim 1, wherein the input vector is one of a given series of functional-test vectors to be used for a functional test of said CMOS circuit.

7. The test-vector editing system according to claim 1, wherein the logic state of the input vector used for the determination performed by said first and second determining means is one relevant to a pin of said CMOS circuit to which either a pull-up or pull-down resistor is connected.

8. The test-vector editing system according to claim 2, further comprising counting means for counting a number of input vectors which are determined by said first determining means as fulfilling said predetermined logic-state condition and input vectors which are determined to be candidate test vector.

9. The test-vector editing system according to claim 1, further comprising means for determining a range of a possibility that the test vector, determined by said second determining means as possibly fulfilling, actually fulfills said predetermined logic-state condition.

10. The test-vector editing system according to claim 9, further comprising sorting means for sorting the test vectors in accordance with the thus-determined ranges of possibilities.

11. The test-vector editing system according to claim 1, comprising:

a CPU comprising said first and second determining means;

a storage device for storing a result of the determination performed by said first and second determining means; and an output device for outputting said result.

12. A test-vector editing method for editing test vectors used for performing a static supply current test of a circuit comprising steps of:

a) determining whether an input test vector, used as an input to test a circuit under test, includes all bits which provide a logic state which surely fulfills a predetermined definite logic-state condition;

b) determining whether one or more bits of said input test vector are indefinite don't care logic-states; and c) selecting as input test vectors the input vectors which provide a logic state which surely fulfills the predetermined definite logic state condition as determined by the first determining step and as candidate input test vectors the input vectors which include one or more indefinite don't care logic states as determined by the second determining step, wherein the indefinite don't care logic-states can be any one of a logical high state, a logical low state and a high impedance state.

* * * * *